(12) United States Patent
Cross et al.

(10) Patent No.: US 7,791,248 B2
(45) Date of Patent: Sep. 7, 2010

(54) PIEZOELECTRIC COMPOSITE BASED ON FLEXOELECTRIC CHARGE SEPARATION

(75) Inventors: L. Eric Cross, State College, PA (US); Wenyi Zhu, State College, PA (US); Nan Li, State College, PA (US); John Y. Fu, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 11/770,318

(22) Filed: Jun. 28, 2007

(65) Prior Publication Data
US 2008/0001504 A1    Jan. 3, 2008

Related U.S. Application Data

(60) Provisional application No. 60/818,164, filed on Jun. 30, 2006.

(51) Int. Cl.
*H01L 41/047* (2006.01)
(52) U.S. Cl. .................... 310/311; 310/363; 310/364; 310/365
(58) Field of Classification Search .................. 310/311
See application file for complete search history.

(56) References Cited

U.S. PATENT DOCUMENTS

| 4,384,394 | A | * | 5/1983 | Lemonon et al. | ........... 29/25.35 |
| 4,572,981 | A | * | 2/1986 | Zola | ............... 310/357 |
| 4,761,711 | A | | 8/1988 | Hiremath et al. | |
| 6,194,228 | B1 | | 2/2001 | Fujiki et al. | |
| 6,376,968 | B1 | | 4/2002 | Taylor et al. | |
| 6,657,364 | B1 | * | 12/2003 | Takeuchi et al. | ........... 310/328 |
| 7,161,148 | B1 | * | 1/2007 | Givargizov et al. | ......... 250/306 |
| 2003/0223155 | A1 | * | 12/2003 | Uchiyama | ................ 360/294.4 |
| 2005/0280335 | A1 | * | 12/2005 | Tomozawa et al. | .......... 310/363 |

OTHER PUBLICATIONS

J. Fousek, L.E. Cross, D.B. Litvin; "Possible piezoelectric composites based on the flexoelectric effect," Materials Letters, 39, 1999, pp. 287-291.
L.E. Cross; "Flexoelectric effects: Charge separation in insulating solids subjected to elastic strain gradients," Journal of Materials Science, 41, 2006, pp. 53-63.
W. Ma, L.E. Cross; "Strain-gradient-induced electric polarization in lead zirconate titanate ceramics," Applied Physics Letters, vol. 82, No. 19, May 12, 2003, pp. 3293-3295.

(Continued)

*Primary Examiner*—Walter Benson
*Assistant Examiner*—Bryan P Gordon
(74) *Attorney, Agent, or Firm*—Gifford, Krass, Sprinkle, Anderson & Citkowski, P.C.

(57) ABSTRACT

An example flexoelectric piezoelectric composite has a piezoelectric response, which may be a direct piezoelectric effect, a converse piezoelectric effect, both effects, or only one effect. The flexoelectric composite comprises a first material, which may be substantially isotropic, the first material being present in a shaped form. The shaped form gives a piezoelectric response due to a flexoelectric effect in the first material. The shaped form may have ∞m symmetry, or a polar variant of this form such as 4 mm symmetry.

24 Claims, 6 Drawing Sheets

OTHER PUBLICATIONS

J.Y. Fu, W, Zhu, N, Li, L.E. Cross; "Experimental studies of the converse flexoelectric effect induced by inhomogeneous electric field in a barium strontium titanate composition," Journal of Applied Physics, 100, 2006.

W. Zhu, J.Y. Fu, N. Li, L. Cross; "Piezoelectric composite based on the enhanced flexoelectric effects," Applied Physics Letters, 89, 2006.

W. Ma, L.E. Cross; "Flexoelectricity of barium titanate," Applied Physics Letters, 88, 2006.

* cited by examiner

FIG – 1A  FIG – 1B  FIG – 1C (Symmetry of FIG 1A)  (Symmetry of FIG 1C)

PIEZOELECTRIC COMPOSITE BASED ON FLEXOELECTRIC CHARGE SEPARATION

REFERENCE TO RELATED APPLICATION

This application claims priority from U.S. Provisional Patent Application Ser. No. 60/818,164, filed Jun. 30, 2006, the entire content of which is incorporated herein by reference.

FIELD OF THE INVENTION

The invention relates generally to flexoelectric materials and their applications.

BACKGROUND OF THE INVENTION

Piezoelectric materials produces a voltage under stress (the piezoelectric effect), and deform under an applied electric field (the converse piezoelectric effect). No material has ever been produced that shows the piezoelectric effect without also having the inverse piezoelectric effect, as the direct and converse effects are thermodynamically identical. Further, the conventional belief is that piezoelectric materials must be non-centrosymmetric, or at least contain a non-centrosymmetric component, which severely limits the material choices available. The most commonly used piezoelectric material is lead zirconate titanate, but there are environmental and public health concerns related to the production and use of any lead-containing material. It has proved difficult to find any better material, using conventional approaches.

Piezoelectric devices have many useful applications, such as high voltage generation (e.g. gas lighters using the resulting spark), microactuators, microbalances, acoustic generators (including ultrasound generators), vibration sensors, and the like. It is impossible in conventional piezoelectrics to break the connection between direct and converse effects. It is also difficult to make either thick or thin film piezoelectrics of high sensitivity. Most current piezoceramics are based on lead containing perovskite structure compositions, and as noted above this is less than ideal. Applications would increase if improved materials were available.

The flexoelectric effect relates to an electric polarization induced by a strain gradient within a material, and the converse effect is a strain in the material induced by an electric field gradient. A flexoelectric material can be centrosymmetric, which would seem to rule out any piezoelectric effect.

The flexoelectric effect is defined by the relationship:

$$P_l = \mu_{ijkl}\left(\frac{\partial S_{ij}}{\partial x_k}\right) \quad (1)$$

where $\mu_{ijkl}$ are the fourth rank polar tensor flexoelectric coefficients, $S_{ij}$ is the elastic strain components, $X_k$ is the direction of the gradient in S, and $P_l$ is the induced electric polarization.

For flexoelectricity (as in piezoelectricity) there is also a converse effect, i.e. there is an elastic stress generated by an electric field gradient defined by the relationship:

$$T_{ij} = \mu_{ijkl}\left(\frac{\partial E_k}{\partial x_l}\right) \quad (2)$$

where $E_k$ is the electric field, $x_l$ the direction of the gradient in E, and $T_{ij}$ the induced stress.

For the direct effect in the MKS system, units for $\mu$ are coulombs/meter, and for the converse effect the units are Newton/volt, which are necessarily equivalent as the direct and converse effects are thermodynamically identical.

SUMMARY OF THE INVENTION

The term flexoelectric piezoelectric material (FP material) may be used for a material exhibiting a response similar to a piezoelectric or converse piezoelectric effect largely clue to a flexoelectric effect within the material. An example flexoelectric piezoelectric composite (FP composite) may be a composite formed from a first material and a second material, the first material having a shaped form so that an applied force induces a stress gradient in the first material, and/or an applied electric field induces an electric field gradient in the first material. A piezoelectric-like response arises from a flexoelectric effect within the first material, which may be a direct piezoelectric effect, a converse piezoelectric effect, both effects, or only one effect. An FP composite comprises a first material, which may be substantially isotropic, the first material being present in a shaped form. The shaped form gives a piezoelectric response due to a flexoelectric effect in the first material. The shaped form may have ∞m symmetry, or a polar variant of this form such as 4 mm.

In some examples, the composite material has a direct piezoelectric response, the material providing an electrical signal in response to an applied force, the shaped form being chosen so that the applied force induces a stress gradient in the first material, so that the electrical signal arises from a flexoelectric effect within the first material.

In other examples, a flexoelectric composite has a converse piezoelectric response, the material providing a mechanical stress in response to an applied electrical field, the shaped form being selected so that the applied electrical field induces an electrical field gradient in the first material, the mechanical stress arising from a flexoelectric effect within the first material.

A flexoelectric piezoelectric composite may comprise first and second materials, the first and second materials having elastic constants differing by at least one order of magnitude, more particularly by more than two orders of magnitude, to facilitate a strong flexoelectric effect at an interface that is at an oblique angle (i.e. not parallel or orthogonal) to the direction of an applied force. In this example, a direct piezoelectric effect is observed, that is enhanced as a stress gradient increases.

in other examples, the first and second materials have electrical permittivities differing by greater than one order of magnitude, more particularly greater than two orders of magnitude. In these examples, a field gradient at an interface that is at an oblique angle (i.e. not parallel or orthogonal) to the direction of an applied field allows a strong flexoelectrically induced converse piezoelectric effect to be observed.

Some composite flexoelectric materials may exhibit an appreciable direct piezoelectric effect, but no appreciable converse piezoelectric effect under the same conditions as which the direct piezoelectric effect is observed. Other composite materials may exhibit an appreciable converse piezoelectric effect, but no appreciable direct piezoelectric effect under the same conditions as which the converse piezoelectric effect is observed. By suitable choice of materials, elastic constant and permittivity properties may be tailored to give direct only, converse only, or both direct and converse piezoelectric effect.

Piezoelectric devices including such piezoelectric materials include sensors (e.g. using a piezoelectric material having a direct effect only), actuators (e.g. using a piezoelectric material having a converse effect only), and the like.

A material may be a composite formed from a first material and a second material, the first material having a shaped form so that an applied force induces a stress gradient in the first material, and/or an applied electric field induces an electric field gradient in the first material, the piezoelectric response arising from a flexoelectric effect within the first material. In some examples, the first material is a ceramic, such as a paraelectric ceramic. Example first materials include barium titanate, barium strontium titanate, and the like. Example shapes include a truncated pyramid, a truncated cone, and the like. The material may be present in a layer having a thickness less than 100 microns, the shapes being generally aligned in a common direction, such as having a central axis generally orthogonal to a substrate. In some examples, a piezoelectric coefficient of greater than 100 µC/N may be obtained for layer thicknesses less than 100 microns.

DETAILED DESCRIPTION OF THE INVENTION

Oriented shapes having at least one surface angled with respect to a force direction in a composite between two elastically dissimilar materials give rise to gradients in the elastic strain even when subjected to a uniform elastic stress, and experiments showed that this charge separation is clue to flexoelectricity. Such a composite may be called a flexoelectric piezoelectric composite (FP composite), i.e. a composite showing a piezoelectric-like effect that arises from flexoelectric effects within the composite. A flexoelectric piezoelectric composite may be formed entirely from centrosymmetric materials, so the choice of materials is vast compared with conventional piezoelectric material design. Example composite materials include a first material having a shaped form, for example a truncated pyramid. The base shape of a pyramid may be triangular, square, rectangular, or other shape. Other possible shapes include a truncated cone, or frustoconical shape. For the first time, such materials were fabricated in the form of truncated pyramid shapes of a first material in air. Other example configurations are possible.

An example material comprises formed elements (such as cones, pyramids, prisms, wedges, or other shape providing an oblique surface angled relative to the direction of pressure, and truncated versions thereof) of a first material within a second material. The first material may be an isotropic material having no intrinsic piezoelectric properties in bulk, and the second material may be air. Other examples include formed elements of a first solid material within a second solid material. The term flexoelectric piezoelectric material (or device) may also be used for a material (or device) exhibiting piezoelectric or converse piezoelectric effect largely due to a flexoelectric effect within a material. These materials include materials that do not include any material that is piezoelectric in bulk, the piezoelectric-like properties arising due to the form of the material(s) used.

An example composite comprises oriented shapes of a first material in a matrix comprising a second material, the two materials being elastically dissimilar. In representative examples, the first and second materials are both dielectrics, and in other examples one material may be a fluid such as air. For example, a composite may comprise air-filed conical or pyramidal voids in a solid matrix.

Figure 1A:
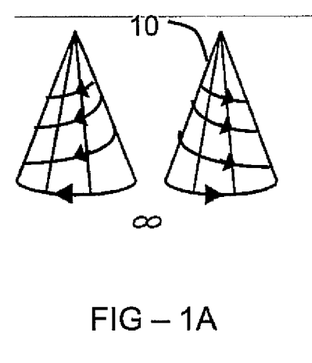
FIGS. 1A-1C show forms representing symmetry groups which allow a flexoelectric effect.
Figure 1B:
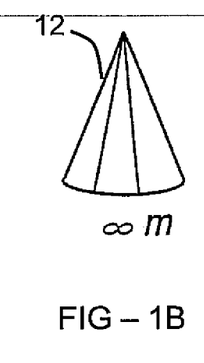
Figure 1C:
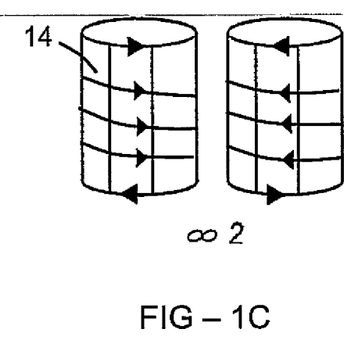

FIGS. 1A-1C show forms representing symmetry groups which allow FP composites, FIG. 1A illustrates the ∞ symmetry at 10, FIG. 1B illustrates the coin symmetry at 12, and FIG. 1C illustrates the ∞2 symmetry at 14. These illustrated Curie symmetry groups allow non-zero piezoelectric coefficients. FIGS. 1A and 1C show structures that may exist in right-handed or left-handed forms.

From symmetry considerations, FP composites of two dissimilar dielectrics made up in the form shown in FIG. 1B have non-zero piezoelectric coefficients, which in matrix notation take the form:

$$\begin{pmatrix} 0 & 0 & 0 & 0 & d_{15} & 0 \\ 0 & 0 & 0 & d_{15} & 0 & 0 \\ d_{33} & d_{31} & d_{31} & 0 & 0 & 0 \end{pmatrix} \quad (3)$$

This holds even if both dielectrics are of centric symmetry so that neither is itself piezoelectric. Symmetry alone dictates what must be present at some level, but gives no clues as to the mechanisms responsible for the effects, or whether any of the necessary coefficients will be of useful magnitude.

Figure 1D:
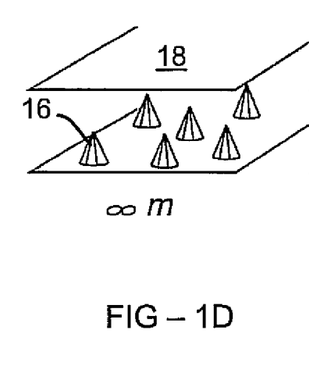
FIGS. 1D-1F show structures having symmetry groups as illustrated in FIG. 1A-1C.
Figure 1E:
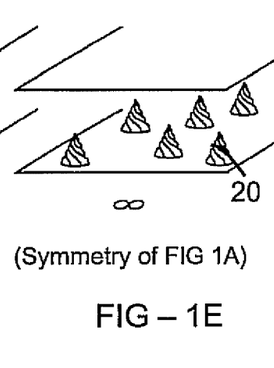
Figure 1F:
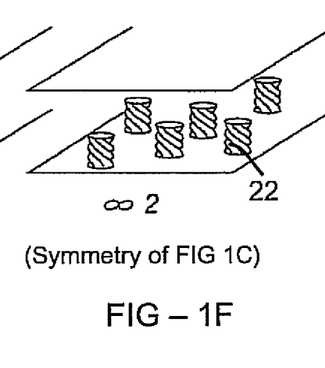

FIGS. 1D-1F show structures having symmetry groups as illustrated in FIG. 1A-1C, for example cones 16 between substrates such as 18, the structures of FIG. 1D being cones having coin symmetry corresponding to FIG. 1B. If such forms are arranged in an orderly manner, as in FIGS. 1D-1F, further showing twisted cones 20 and twisted cylinders 22, to form a two phase composite, and both phases are insulators, even if neither phase is piezoelectric the composite ensemble exhibits some degree of piezoelectricity. Further, if in all groups the ∞ axis is taken as x3 the matrices of the non-zero piezoelectric constants are as shown in the matrix above.

For the corn symmetry, even if non-piezoelectric materials (in bulk) are used, the two phases differ in elastic properties so that a conical or pyramidal foul, gives rise to an axial stress gradient, even if the composite is subjected to a uniform stress. The gradient then acts through the flexoelectric effect to produce charge separation.

Symmetry only dictates what is present or absent, and gives no indication as to the magnitude of an effect. Experiments discussed herein demonstrated for the first time that flexoelectricity leads to usable piezoelectric-like properties in a properly configured composite.

Previous discussions of such symmetry groups, for example J. Fousek, L. E. Cross, and D. B. Litvin, Materials Letters, 39, 287-291 (1999) speculate on the properties of such materials. However, no practical implementation was suggested, nor was there any appreciation that properties far superior to conventional materials, in particular existing lead-free materials, were obtainable. Further, application of stresses is facilitated by truncated forms.

Example composite materials according to embodiments of the present invention include a first material having a shape, for example a truncated cone (frustoconical shape), other shape representing the symmetry of Curie group ∞m as shown in FIG. 1B, or other shape allowing piezoelectric coefficients within an isotropic material. Other examples include a simple 0-3 composite preserving ∞m symmetry. Other examples include pyramids (in particular truncated pyramids), and the like. The base shape of a pyramid may be triangular, square, rectangular, or other shape.

An example composite comprises oriented truncated pyramidal or truncated conical shapes of a first material in a matrix of a second material, where the two materials are elastically dissimilar. In representative examples, the first and second materials are both dielectrics, and the first or second material may be a fluid such as air.

Oriented shapes having at least one surface angled with respect to a force direction in a composite between two elastically dissimilar materials gives rise to gradients in the elastic strain even when subjected to a uniform elastic stress, and experiments showed that this charge separation is due to flexoelectricity. Such a composite may be called a flexoelectric piezoelectric composite, i.e. a composite showing an overall piezoelectric-like effect that arises from flexoelectric effects within the composite. A flexoelectric piezoelectric composite may be formed entirely from centrosymmetric materials, so the choice of materials is vast compared with conventional piezoelectric material design.

Figure 2:
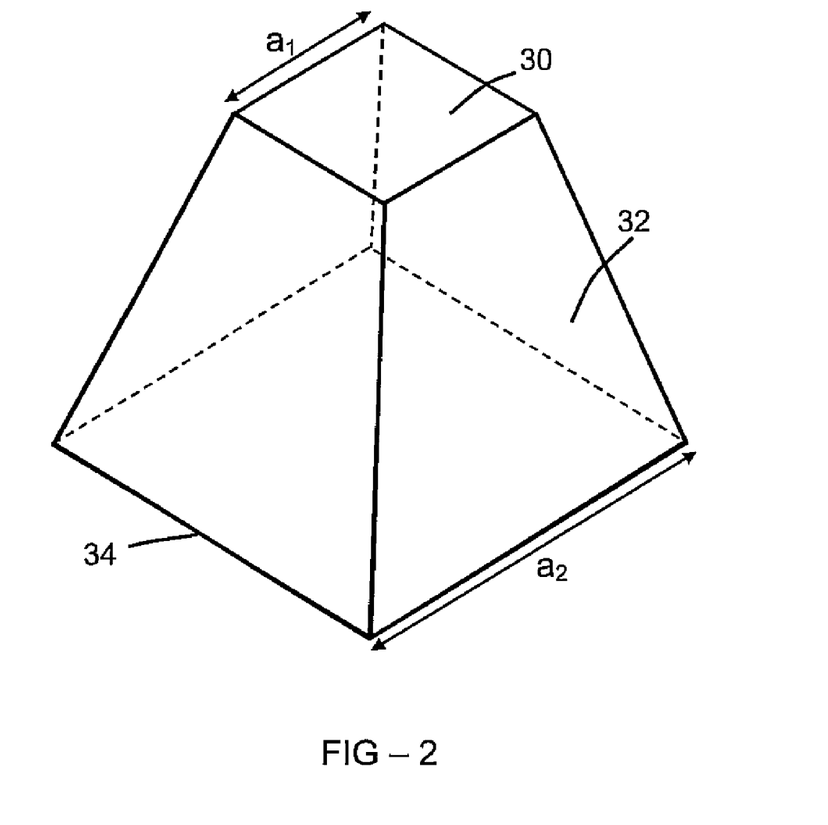
FIG. 2 shows a possible shaped form, in this example a truncated pyramid.

FIG. 2 shows a possible shaped form (or building unit) in the form of a truncated pyramid. The truncated pyramid has a top surface 30, sloping sides 32, and base 34. The base and top surface may be similarly shaped, for example as a square or rectangle. A top surface dimension $a_1$ and base dimension $a_2$ are shown. In a square pyramid, the orthogonal dimensions of the top surface and base are also $a_1$ and $a_2$, respectively.

Hence, a piezoelectric-like material is achieved using one or more shapes, such as a pyramid, cone, prism (e.g. triangular prism), or other shape, including shapes having a base with a larger area than a top surface and at least one side wall having an appreciable angle to the direction of application of force (stress and/or strain). Using smaller dimensions, for example a thickness (or pyramid height, the distance between the top surface and the base) of 250 microns or less, in particular 100 microns or less, remarkably high values of piezoelectric coefficient can be obtained.

Figure 3:
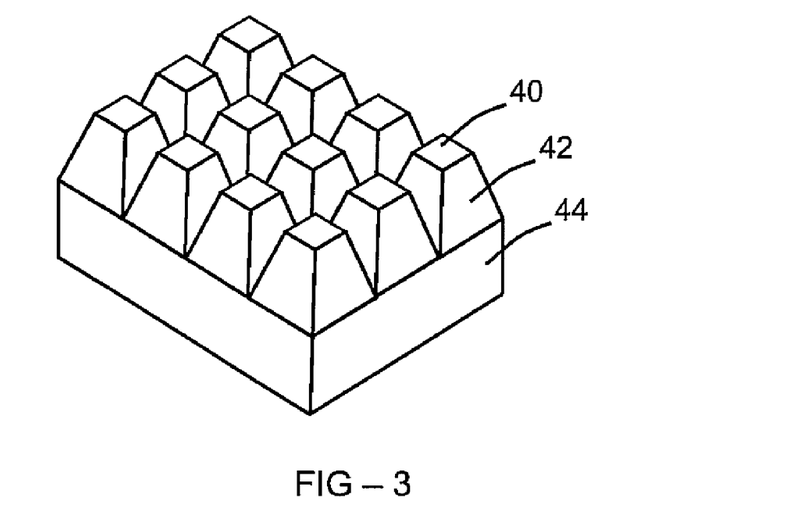
FIG. 3 shows an array of truncated pyramids on a substrate.

FIG. 3 shows an array of truncated pyramids 40 on a substrate 42. A top substrate, not shown for illustrative clarity, may also be used. Electrically conducting layers may be used to collect piezoelectric-induced charge.

The pyramids (or other shapes) may abut each other at the base or be separated. In representative examples, the pyramids may comprise a solid first material such as a ceramic. The second material, generally surrounding the sloping sides of the pyramid, may be a solid or a gas. In examples studied experimentally, the first material was barium strontium titanate, and the second material was air. In other examples, the second example may be a polymer, such as a polymer generally soft in comparison to a ceramic first material.

The upper surface of the structure, including sides and top surfaces of the pyramids, along with the lower surface of the substrate (upper and lower in reference to the illustrated orientation and not further limiting) may be coated with electrically conducting materials so as to provide first and second electrodes.

Figure 4:
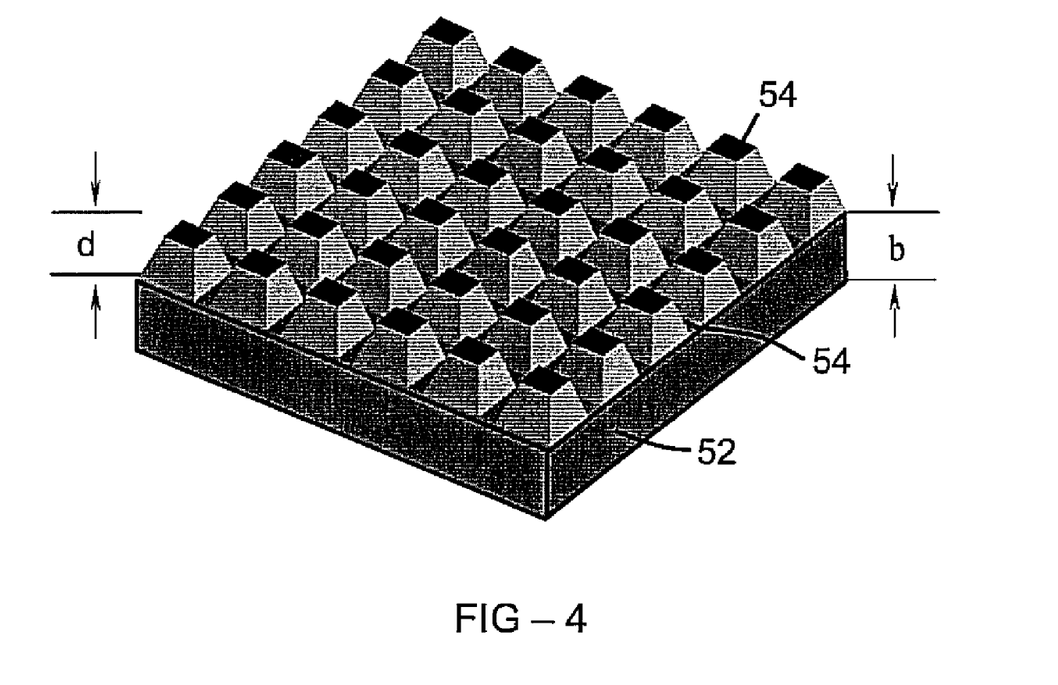
FIG. 4 shows an array of truncated pyramids supported by substrate with separation gaps between proximately adjacent pyramids.

FIG. 4 shows an array of truncated pyramids 50 supported by substrate 52, with separation gaps 54 between proximate pyramids.

Material Selection

The flexoelectric coefficients in common dielectrics are small, typically with $\mu_{ijkl}$~$10^{-10}$ C/m. However, theoretical studies (e.g. A. K. Tagantsev, *Soviet Physics, JETP,* 61, 1246, 1986) suggest that in high permittivity dielectrics, the $\mu_{ijkl}$ could take the form:

$$\mu_{ijkl} = \gamma \chi_{kl}\left(\frac{e}{a}\right) \quad (4)$$

where γ is a constant of order unity,
$\chi_{kl}$ is the dielectric susceptibility,
e is the electric charge in the unit cell, and
a is the unit cell dimension.

This suggests that much higher $\mu_{ijkl}$ can be achieved in a soft mode ferroelectric like dielectrics, and this has been verified experimentally, for example as discussed in W. Ma, and L. E. Cross, *Appl Phys. Lett.* 82, 3293, (2003).

Surprisingly, lead based compositions like lead zirconate titanate (PZT), which are excellent piezoelectrics, have γ almost one order smaller than barium based compositions like BST and BaTiO$_3$. Hence, flexoelectric piezoelectric ceramics can be lead free without compromising performance.

In barium strontium titanate (Ba$_{0.67}$Sr$_{0.33}$)TiO$_3$, $\mu_{11}$ is approximately 100 μC/m, some 6 orders larger that the typical values for conventional common dielectrics. Experiments confirmed that $\mu_{11}$ measured by both direct and converse methods for BST are identical within experimental error.

Example materials which may be used as materials in a flexoelectric piezoelectric include oxides, such as titanates, in particular barium titanate, strontium titanate, barium strontium titanate (BST), other titanates, and other oxides. Example materials include high-K ceramics. Example materials include compounds of barium, compounds of strontium, compounds of zirconium, and the like. In other examples, polymers may be used as one or both of the components of a ferroelectric piezoelectric composite.

Other paraelectric perovskite structure ceramics have large values of flexoelectric coefficients $\mu_{11}$, $\mu_{12}$, and are good choices for a material used in a piezoelectric-like composite.

Fabrication and Characterization of a Flexoelectric Composite

A material was fabricated, and piezoelectric measurements obtained, for a millimeter scale flexoelectric piezoelectric (FP) composite designed to have an easily measurable piezoelectric coefficient $d_{33}$, and an easily calculable $d_{33}$ response, induced by a flexoelectric origin, from the known flexoelectric and elastic properties of the constituent phases. The existence of a measured piezoelectric-like response was demonstrated, and showed experimental evidence that the charge separation mechanism involved is flexoelectricity.

A flexoelectrically driven piezoelectric composite was constructed from barium strontium titanate (BST) and air. Both components of the FP composite are centric dielectrics, the first time a piezoelectric-like response has been obtained without a non-centrosymmetric component. The material has appropriate shaped internal surface configurations such as illustrated in FIG. 1. The material demonstrated a clear piezoelectric-like signal as measured on a conventional Berlincourt $d_{33}$ meter.

Barium strontium titanate was chosen as strong flexoelectric component, $Ba_{0.67}Sr_{0.33}TiO_3$. To generate a strong $S_{3(1)}$ strain gradient, a close packed 3×3 array of millimeter scale square truncated pyramids was cut into the flat face of a BST ceramic sheet. The pyramid surfaces and the obverse side of the BST sheet were sputter coated with gold electrodes, and a robust stress distributing brass electrode was mounted on the upper surface of the pyramid array with conductive silver epoxy. Hence, a practical piezoelectric demonstrator was fabricated from BST ceramic at the $(Ba_{0.67}Sr_{0.33})TiO_3$ composition, which had a measured $\mu_{11}$=120 µc/m at 25° C.

Figure 5A:
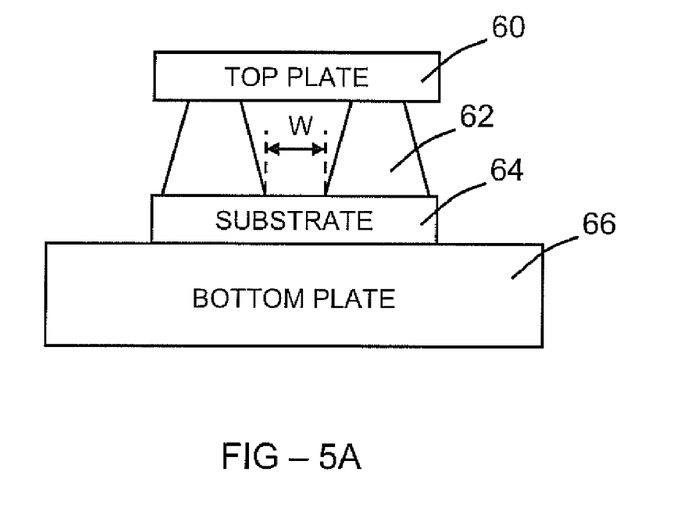
FIG. 5A illustrates a configuration used to evaluate piezoelectric materials.

FIG. 5A illustrates a configuration used to evaluate piezoelectric materials. The configuration shown includes top plate 60, FP material comprising pyramidal shapes 62, substrate 64, and bottom plate 66.

For converse piezoelectric effect evaluation, the top and bottom plates both comprised polished glass, and a laser interferometric method was used to detect dimension changes on application of an electric field. The optional substrate 64 may comprise the same material as the pyramids 62, or otherwise be used for growth, formation, and/or support of the pyramids.

For direct piezoelectric effect evaluation, the top and bottom plates were pressure surfaces such as metal, and were used to apply stress to the materials, with electrical signals detected between electrodes in contact with the base and top surface and sides of the pyramid shapes.

Figure 5B:
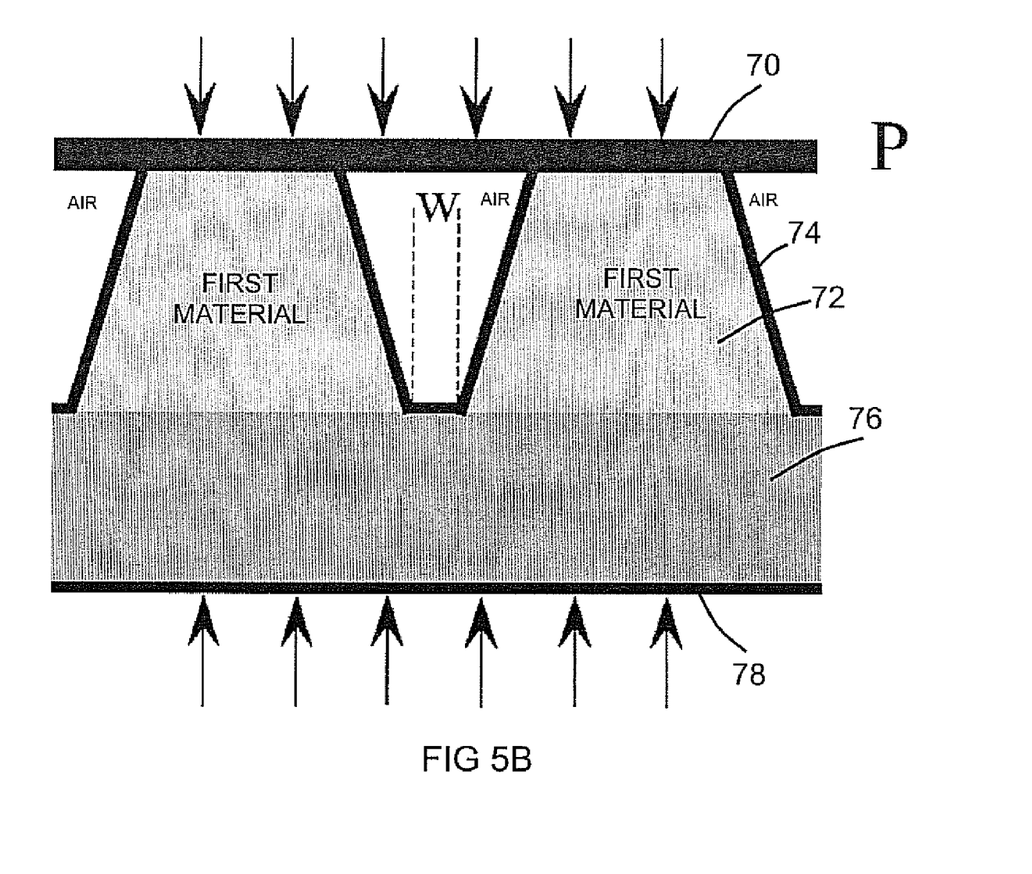
FIG. 5B illustrates a configuration for $d_{33}$ measurement.

FIG. 5B shows a configuration for $d_{33}$ measurement, using a top metal plate 70, pyramids (in cross-section) 72, upper electrode 74 shown as a thick black line, substrate 76, and lower electrode 78. The arrows indicate application of stress.

Figure 6A:
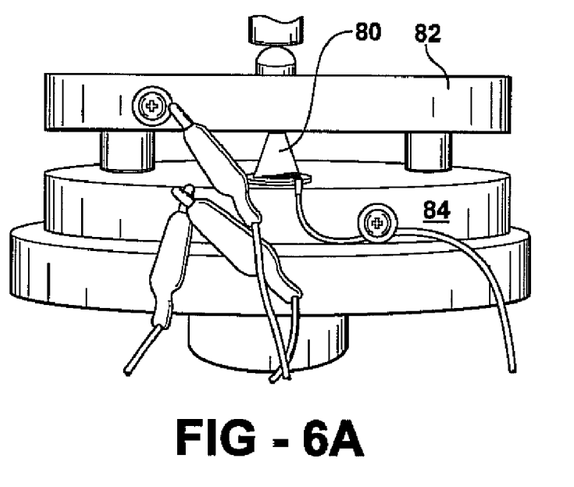
FIG. 6A illustrates an experiment configuration used to evaluate a shaped form.

FIG. 6A illustrates an experiment used to evaluate a pyramidal shape 80, between upper and lower pressure plates 82 and 84 respectively.

Figure 6B:
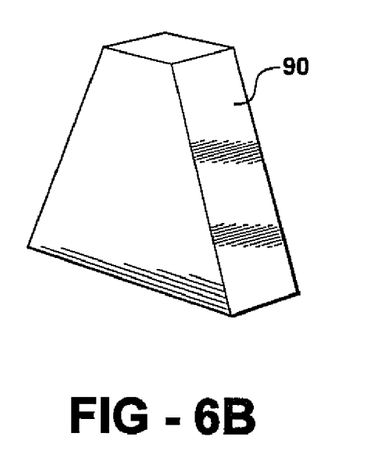
FIG. 6B illustrates a truncated rectangular pyramid 90 of barium strontium titanate (BST) used in some experiments.

FIG. 6B illustrates a truncated rectangular pyramid 90 of barium strontium titanate used in some experiments.

Figure 6C:
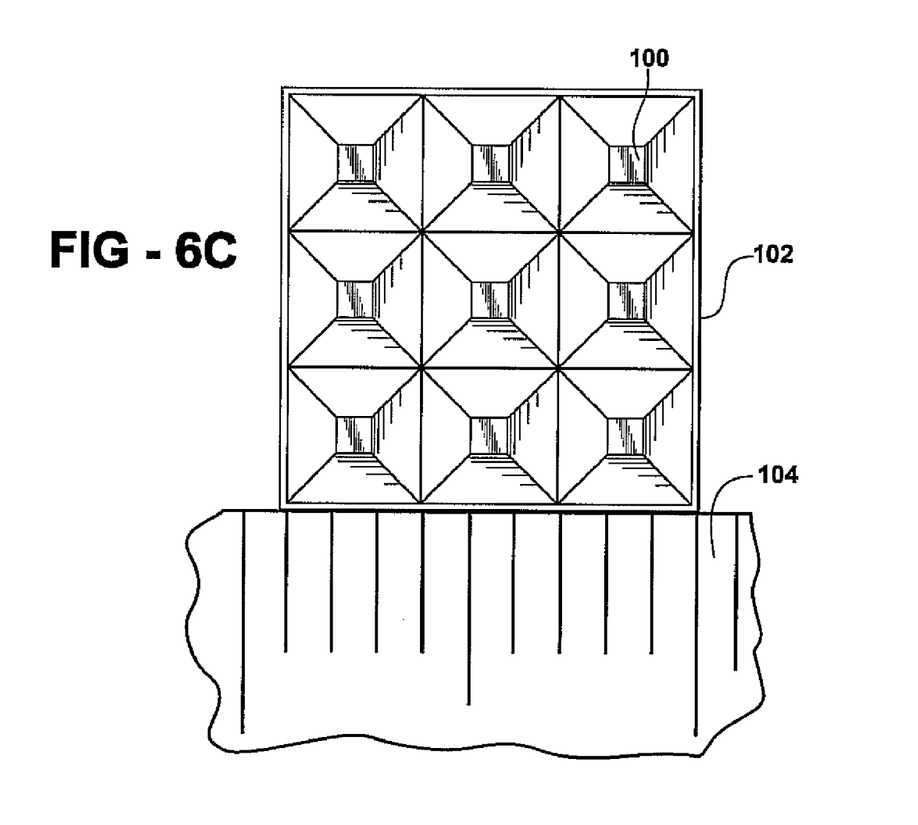
FIG. 6C shows a photograph of a 3×3 array of BST pyramids on a BST substrate.

FIG. 6C shows a photograph of a 3×3 array of BST pyramids 100 machined from a 1.28 mm thick block, leaving a 0.52 mm thick BST substrate 102. The top view of the structure was photographed against a millimeter scale 104. For experiments with this structure, for uniform stress distribution a 1 mm thick aluminum platters covered the upper face. Since under uniform applied stress the axial strain gradient extends down the slanting pyramid faces, the whole upper surface was electroded with sputtered gold.

For piezoelectric measurements, a piezoelectric material was placed between the contacts of a standard Berlincourt $d_{33}$ meter (model ZJ-2), which uses an elastic drive signal at 100 Hz and compares the piezoelectric output to that of a built in PZT standard. To establish the confidence level a rectangular block of BST at the same composition was measured in the $d_{33}$ meter yielding the value 0.4 pC/N.

An experiment was performed with a material as shown in FIG. 6C, using the set-up of FIG. 5B, having a 3×3 array of truncated pyramids having dimensions $a_1$=1.13 mm, $a_2$=2.72 mm and pyramid height, d=0.76 mm. The gap spacing W was 190 microns. The materials were evaluated for up and down orientations of the pyramids in the Berlincourt meter, giving values of $d_{33}$ of 6.0 and 6.3 pC/N respectively. The differences may be due to different stress distributions in the two experimental configurations. These results were corrected for capacitance effects. The temperature was 24° C., where BST was in the paraelectric state.

Assuming flexoelectricity as the origin of the piezoelectric-like response, the relation between $d_{33}$ and $\mu_{11}$ for an axial stress gradient in the composite takes the form $$d_{33} = \frac{\mu_{11} \nabla_3 T_3}{c_{11} T_3^1} \quad (5)$$

where $\nabla_3 T_3$ is the axial stress gradient in the ceramic,
$T_3^1$ the uniform axial stress applied to the composite, and
$C_{11}$ the elastic constant of the ceramic.

Using a finite element method to calculate the gradient, a calculated $d_{33}$=6.0±1 pC/N was determined for the same sample. The experimental results proved that the composite has a piezoelectric-like response, in spite of the fact that all component elements are centric, which forbids piezoelectricity unless the shape has special symmetry forms discussed above in relation to FIG. 1A-F. This is the first time such a composite has been made. The agreement of experimental and theoretical results confirms that flexoelectricity is the origin of the observed piezoelectric-like effect in these materials.

Enhanced Piezoelectric-Like Effect at Small Dimensions

A dramatic enhancement of the piezoelectric-like effect is possible at smaller dimensions. For example, using a square truncated pyramid as the element in a composite, the upper square face has a side of length $a_1$, and the base dimension length is $a_2$, as shown in FIG. 2. In this example, the side wall 32 is configured so that $a_2$ is a linearly increasing function of d, the depth from $a_1$ to $a_2$. For a force F applied normal to the upper and lower surfaces, the stress in the upper surface will be $T_{3(1)}$=F/$a_1^2$ and will give rise to a strain $S_{3(1)}$ given by $S_{3(1)}$=F/$a_1^2 c_{11}$, where $c_{11}$ is the elastic constant of the truncated pyramid.

Similarly for the lower surface, $T_{3(2)}$=F/$a_2^2$, giving rise to a strain $S_{3(2)}$ given by $S_{3(2)}$=F/$a_2^2 c_{11}$.

Since the side walls are configured to make $a_2$ a linear function of d, $$\frac{\partial S_3}{\partial d} = \frac{S_{3(1)} - S_{3(2)}}{d} = \frac{F\left(\frac{1}{a_1^2} - \frac{1}{a_2^2}\right)}{dc_{11}}. \quad (6)$$

If the pyramid material has a flexoelectric coefficient $\mu_{11}$, then $$P_3 = \mu_{11} \frac{\partial S_3}{\partial d_3} = \mu_{11} \frac{F\left(\frac{1}{a_1^2} - \frac{1}{a_2^2}\right)}{dc_{11}} = \mu_{11} \frac{\frac{a_2^2 - a_1^2}{a_1^2}}{dc_{11}} \cdot \frac{F}{a_2^2} \bigg| \quad (7)$$

i.e., $$P_3 = \mu_{11} \frac{\left(\frac{a_2^2 - a_1^2}{a_1^2}\right)}{dc_{11}} T_3 \quad (8)$$

but for a piezoelectric sheet:

$$P_3 = d_{33} T_3, \quad (9)$$

so that:

-continued $$d_{33} = \mu_{11} \frac{\left|\left(\frac{a_2^2 - a_1^2}{a_1^2}\right)\right|}{dc_{11}} \quad (10)$$

For BST at room temperature $\mu_{11}$~100 $\mu$C/m, and $c_{11}$=1.66×10$^{11}$ N/m. For $a_1$=50 $\mu$m, $a_2$=250 $\mu$m, d=250 $\mu$m, then $d_{33}$≈60 pC/N. Scaling down, for example, $a_1$=5 $\mu$m, $a_2$=25 $\mu$m, d=25 $\mu$m, and then $d_{33}$≈600 pC/N. This value is remarkably high, and achieved with readily achieved dimensions.

Because they are gradient driven, the piezoelectric coefficient $d_{33}$ will increase linearly with decreasing composite thickness (i.e. pyramid height, d), for example:

| Millimeter scale | 6 pC/N |
| 100 $\mu$scale | 60 pC/N |
| 10 $\mu$scale | 600 pC/N |
| 1 $\mu$scale | 6,000 pC/N |

These are representative values, which vary with material and exact configuration. Macro-scale device thicknesses can be obtained using a multilayered micron-scale thickness layers.

In conventional composites piezoelectrics the piezoelectric activity decreases markedly as the dimensions are reduced into the micron range. Both thick and thin film materials have reduced $d_{ij}$ constants. In the flexoelectric piezoelectric materials according to embodiments of the present invention, because charge separation is gradient driven, activity increases as the dimensions are reduced.

For a properly designed square pyramid, the uniform stress gradient $T_{3(1)}$ steepens with decreasing scale as 1/d, where d is the pyramid height. Hence, for a BST flexoelectric piezoelectric composite, a value of $d_{33}$ comparable to that of lead zirconate titanate is expected to be at the micrometer scale.

Figure 7:
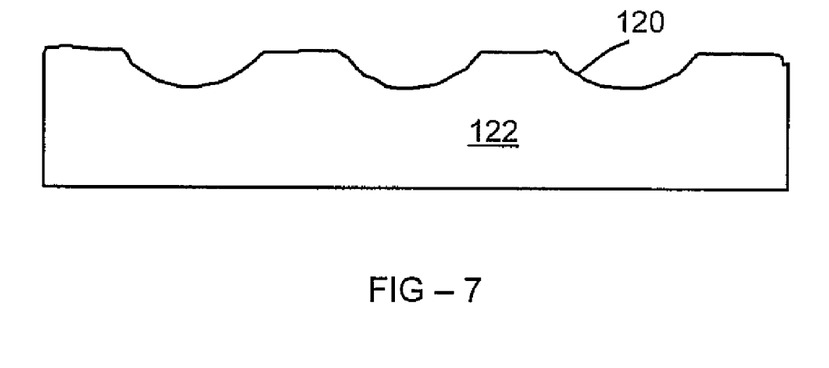
FIG. 7 shows a profile obtained by machining a ceramic at micron scale using an insufficiently hard blade.

Two composites were fabricated to have a form as shown in FIG. 4. For the first composite, the pyramid height d and substrate thickness b were both 50 microns, and the gap spacing between pyramids was 29 microns ("W" in FIG. 5). For the second composite, pyramid height and substrate thickness were both 100 microns, and gap spacing was 28 microns. Preliminary results for the converse piezoelectric-like effect, using polished glass top and bottom plates and an interferometric technique, indicated $d_{33}$~50 pC/N for the first composite and 25 $\mu$pC/N or the second composite. The profile of the second ceramic, shown approximately at 120 in FIG. 7 on substrate 122, do not curve in the desired manner due to bending of the cutting blades (designed for biological materials) in the ceramic. However, these results show the general trend expected from theory, showing that piezoelectric coefficient greater than 100 pC/N may be obtained using device structures having dimensions in the tens of microns.

Independent Control of Direct and Converse Piezoelectric-Like Effects

As the charge separation is gradient driven, it is possible to design composites where uniform stress will drive large strain gradient leading to strong direct piezoelectric-like effects. However, in the same materials, a uniform field will not generate strong field gradients, giving not converse piezoelectric-like effect.

In some examples, a uniform electric potential difference will generate strong electric field gradients, but a uniform stress will not generate large strain gradients, leading to a composite with strong converse piezoelectricity but no direct piezoelectric-like effect.

In some examples, materials are fabricated in which the piezoelectric-like response is generated by flexoelectric properties of a first material. The first material can be chosen so as to have large flexoelectric coefficient, and shapes for these first materials chosen so that when properly mutually oriented with respect to a second material, the material converts a uniform applied elastic stress (or electric field) into a strong internal electric field gradient (or elastic stress gradient) in the first material, which may be considered as the active flexoelectric phase.

The second material can be chosen to have a high compliance constant and a low dielectric permittivity relative to the first component. Resultant electric polarization due to applied stress (or elastic stresses due to applied fields) are summed to generate the piezoelectric-like effect resulting from the Curie group symmetry of the composite. If the dielectric properties of the first and second materials are matched, under a uniform electric field applied to the composite, no electric field gradient will occur in the flexoelectric component; thus no flexoelectric stress will be generated, and consequently no converse piezoelectric-like effect will appear in the composite. However, if the elastic properties of the two component phases are simultaneously drastically mismatched, then under a uniform elastic stress applied to the composite, a strain gradient will appear in the flexoelectric component that will generate an electric polarization, and consequently the direct piezoelectric-like effect will appear in the composite.

A material according to embodiments of the present invention allows independent control of direct and converse piezoelectric-like effects. Hence, devices may be configured to show the direct effect but not the converse effect, or vice versa, or any desired combination of direct and converse effect magnitudes. Hence, devices according to the present invention include sensors that do not actuate, unlike any conventional piezoelectric sensor, and actuators that do not sense. This is a very useful separation of functions that allows novel smart materials to be designed. Independent control of direct and converse effects allows design of new smart materials for acoustic signature and vibration control. Compact highly active FP composites facilitate new MEMs applications in robotics and unmanned vehicles.

For sensor-only applications (converse effect only), a composite may be made from components having similar elastic constants, but different dielectric properties. For example, cones of a high dielectric material may be arranged in a low dielectric material.

Hence, for the first time, materials according to embodiments of the present invention may be designed to provide sensing without actuation, or actuation without sensing. For the first time it will be possible to make piezoelectric-like sensors which will not actuate and piezoelectric-like actuators which will not sense. These are useful for smart system applications and noise control. Either the piezoelectric effect only, the converse piezoelectric effect only, or both can be obtained using suitable material choices.

Frequency and Temperature Dependent Effects

The direct and converse piezoelectric-like effects for a flexoelectric piezoelectric composite are influenced by temperature and frequency effects of permittivity and elastic properties. Hence, a material may be designed that shows only the one effect at a predetermined temperature or frequency, and the other effect (or combination of effects) at a second temperature or frequency.

For example, at frequencies above dielectric relaxation of a first component, the permittivity may then match that of a second component, so that no converse piezoelectric effect is observed from a composite.

For example, at temperatures above a glass transition, melting transition, or other transition of one component, elastic mis-match of two components may be achieved (or removed), allowing a strong direct piezoelectric-like effect (or elimination of such effect).

Other examples will be apparent to those skilled in the art.

Further Examples and Discussion

Embodiments of the present invention include composites that do not include a centrosymmetric material, or at least in which the piezoelectric-like effect does not arise from the piezoelectric properties of any single component.

Figure 8:
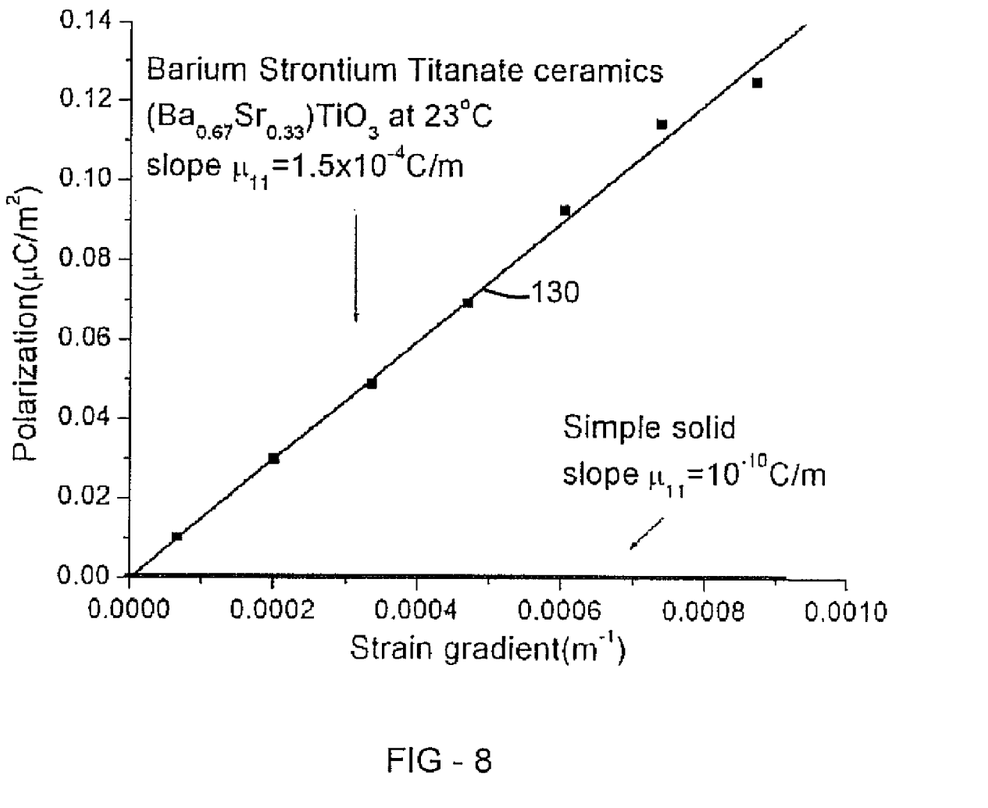
FIG. 8 further illustrates the effect of flexoelectricity in obtaining a piezoelectric effect.

FIG. 8 further demonstrates the effect of flexoelectricity in obtaining a piezoelectric-like effect. Strain gradients can be obtained using the described shaped forms, and also through bar-bending experiments for evaluation purposes.

Examples include composites of two or more components, including a first material and a second material. The first and second materials have an interface inclined at an oblique angle to the direction of obtained electric field. In some examples, the first material is in the form of a cone, frusto-conical shape, pyramids, truncated pyramid, triangular prism, other geometrical or non-geometrical shape, or mixture thereof. There may be one or more such shapes in the composite material. In some examples, the shapes are oriented, and/or are arranged in a regular array.

The term "composite", as used here, includes composites where the second material is air, so that there is only a single solid component, that is shaped as desired. The desired shapes may be formed by molding, cutting, or other physical, chemical, and/or mechanical process. Deformation of a multi-component composite after formation may be used to obtain or improve desired interface orientations.

In other examples, composites may comprise two or more solid dielectric materials. Other combinations are possible, including solid/solid, solid/gas, solid/liquid, and solid/liquid crystal. Solids include crystalline, amorphous, ceramic, glass, polymer, or other materials. One or both materials may be porous, or otherwise contain voids. Example materials include strontium titanate, barium titanate, and Z5U dielectrics.

The composite material may be sandwiched between parallel electrical conducting plates, an electrical potential being obtained between the plates when a stress is applied normal to the plates. An electrical field can be obtained even where the composite is entirely centrosymmetric and there are no stress gradients in the externally applied stress. The composite may include a plurality of shapes of a first material dispersed through a second material. The composite may include two or more components.

In some embodiments, the composite includes at least two materials that are two materials are elastically dissimilar, such as an elastic modulus one or more orders of magnitude different. The two materials have an interface configured so as to generate a flexoelectric electric field having a component along a desired direction.

In other examples, a piezoelectric-like device may be formed by a material according to the present invention between a pair of substrates. The substrates may be metal plates, electrode layers, or other electrically conducting materials, for example as previously described, or one or both may be non-conducting. Separate components may be used for application of pressure to a device, and collection of electrical signals. There may be a conducting layer disposed on e.g. the surfaces of cones or pyramids of the first material at which the electric potential is developed.

The angle of the sloping sides, e.g. the cone angle of conical shapes, may be adjusted to maximize the signal while allowing stress propagation. The optimum angle depends on the materials used.

At present, lead zirconate titanate (PZT) is superior to other ceramic piezoelectrics, and dominates commercial applications despite the lead content. At present, there is no competitive conventional lead-free competitor. However, embodiments of the present invention include lead-free composites with piezoelectric-like properties comparable to PZT.

Further, PZT does not retain its excellent properties in thin film form. In contrast, flexoelectrics are gradient driven and improve as they become thinner. Composites according to embodiments of the present invention are excellent for MEMS and high frequency ultrasound applications.

In conventional materials, direct and converse effects are thermodynamically equivalent and are always equal. In the gradient driven systems, strain and field gradients can be independently tailored to break the thermodynamic equivalence. Hence, direct, converse, or some combination of effects are achievable.

Applications

Applications include: improved materials for sonar and medical ultrasound systems; fine scale composites that are particularly appropriate for high frequency ultrasound; smart systems able to make use of independent control of direct and converse effects, such as active systems for acoustic stealth; high activity MEMs systems; miniaturized control for unmanned vehicles; composites with an apparent piezoelectric constant orders of magnitudes greater than conventional materials arising from new artificial symmetries; chemistry on a chip applications; an improved fingerprint scanner; sonar applications; miscreant control devices; and improved piezoelectric transducers and loudspeakers.

Pixel driven phased arrays in high frequency ultrasound need high power from small pixel elements. To get high power in at low voltage for simple CMOS control requires high dielectric permittivity. For PZT $\in_r$ max ~3,000, whereas in $(Ba,Sr)TiO_3$, $\in_r$ max ~20,000, a significant advantage for applications where high permittivity is desired.

Patents, patent applications, or publications mentioned in this specification are incorporated herein by reference to the same extent as if each individual document was specifically and individually indicated to be incorporated by reference.

The invention is not restricted to the illustrative examples described above. Examples are not intended as limitations on the scope of the invention. Methods, apparatus, compositions, and the like described herein are exemplary and not intended as limitations on the scope of the invention. Changes therein and other uses will occur to those skilled in the art. The scope of the invention is defined by the scope of the claims.

Having described our invention, we claim:

1. An apparatus providing an electrical signal in response to an applied force, the apparatus comprising:
a first substrate;
a second substrate;
a layer located between the first substrate and the second substrate, the layer including at least one shaped form of a first material,
the applied force being applied between the first and second substrates,
the shaped form being configured so that the applied force induces a region of stress gradient in the shaped form, the shaped form having a sloping side configured to be non-parallel and non-orthogonal to the applied force, the layer having a layer thickness less than 250 microns;

a first electrode adjacent the sloping side so as to contact the region of stress gradient; and a second electrode, the first substrate being located between the second electrode and the layer, the first and second electrodes providing an electrical signal in response to the applied force, the electrical signal originating from a flexoelectric effect in the shaped form.

2. The apparatus of claim 1, wherein the shaped form has ∞m symmetry, or an analogous polar form thereof.

3. The apparatus of claim 1, wherein the shaped form is truncated cone or truncated pyramid.

4. The apparatus of claim 1, the first electrode being proximate regions of stress gradient within the shaped form so as to pick up a flexoelectric electric potential from the shaped form.

5. The apparatus of claim 1, the first material being a centrosymmetric material.

6. The apparatus of claim 1, wherein the layer further includes a second material disposed around the shaped form.

7. The apparatus of claim 6, the first and second materials having first and second elastic constants respectively, the first and second elastic constants differing by at least one order of magnitude.

8. The apparatus of claim 7, the first material being a ceramic.

9. The apparatus of claim 8, wherein the second material is air.

10. The apparatus of claim 9, wherein the second material is a polymer.

11. The apparatus of claim 7, the apparatus providing no appreciable mechanical response in response to an electric field applied between the electrodes.

12. The apparatus of claim 7, wherein the first and second materials have electrical permittivities differing by less than one order of magnitude.

13. The apparatus of claim 1, the layer comprising an array of shaped forms.

14. The apparatus of claim 1, wherein the first material is a paraelectric perovskite structure material.

15. The apparatus of claim 1, wherein the first material is barium titanate.

16. The apparatus of claim 1, wherein the first material is barium strontium titanate.

17. The apparatus of claim 1, wherein the apparatus is a sensor device.

18. An apparatus providing an electrical signal in response to an applied force, the apparatus comprising:

a first substrate;

a second substrate;

a layer located between the first substrate and the second substrate, the layer including at least one shaped form of a material, the material being a centrosymmetric material, the applied force being applied between the first and second substrates, the shaped form being configured so that the applied force induces a region of stress gradient in the shaped form, the layer having a layer thickness less than 250 microns; and first and second electrodes providing an electrical signal in response to the applied force, the electrical signal originating from a flexoelectric effect in the shaped form, the shaped form having a sloping side configured to be non-parallel and non-orthogonal to the applied force, the first electrode being adjacent the sloping side so as to contact the region of stress gradient within the shaped form, the first substrate being located between the second electrode and the layer.

19. The apparatus of claim 18, the first material being a titanate.

20. The apparatus of claim 18, the first material being a barium compound.

21. The apparatus of claim 18, the first material being a barium titanate.

22. The apparatus of claim 18, the first material being barium strontium titanate.

23. The apparatus of claim 18, wherein the apparatus is a sensor.

24. The apparatus of claim 18, wherein the apparatus provides no appreciable mechanical response in response to an electric field applied between the electrodes.

* * * * *

UNITED STATES PATENT AND TRADEMARK OFFICE
CERTIFICATE OF CORRECTION

| | | |
|---|---|---|
| PATENT NO. | : 7,791,248 B2 | Page 1 of 1 |
| APPLICATION NO. | : 11/770318 | |
| DATED | : September 7, 2010 | |
| INVENTOR(S) | : L. Eric Cross et al. | |

It is certified that error appears in the above-identified patent and that said Letters Patent is hereby corrected as shown below:

Col. 1, line 3, add the following governmental clause:

"STATEMENT OF GOVERNMENT SUPPORT

This invention was made with government support under Contract No. N00014-06-1-1059, awarded by the Office of Naval Research. The Government has certain rights in this invention."

At column 2, line number 10, "clue" should be "due".

At column 2, line number 47, "in" should be "In".

Signed and Sealed this
Twenty-fifth Day of October, 2011

David J. Kappos
*Director of the United States Patent and Trademark Office*